(12) United States Patent
Quinn (10) Patent No.: US 8,330,536 B1
(45) Date of Patent: Dec. 11, 2012

(54) DIFFERENTIAL REFERENCE INTERFACE WITH LOW NOISE OFFSET CANCELLATION

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 93 days.

(21) Appl. No.: 12/973,128

(22) Filed: Dec. 20, 2010

(51) Int. Cl.
  *H03F 1/02* (2006.01)
(52) U.S. Cl. ............... 330/9; 330/51; 330/302; 330/109
(58) Field of Classification Search .............. 330/9, 51, 330/302, 109
  See application file for complete search history.

(56) References Cited

U.S. PATENT DOCUMENTS

| | | | | |
|---|---|---|---|---|
| 4,565,971 A * | 1/1986 | Brookshire | ...................... | 330/9 |
| 5,258,664 A * | 11/1993 | White | .............. | 327/91 |
| 6,509,746 B1 * | 1/2003 | Wang | ............. | 324/678 |
| 6,697,444 B1 * | 2/2004 | Iizuka et al. | ........... | 375/343 |
| 6,753,801 B2 * | 6/2004 | Rossi | ............. | 341/161 |
| 6,967,611 B2 * | 11/2005 | Atriss et al. | ........... | 341/172 |
| 7,518,439 B1 * | 4/2009 | Fong | ............. | 330/9 |
| 2011/0279148 A1 * | 11/2011 | Watanabe | ........ | 327/96 |

\* cited by examiner

*Primary Examiner* — Patricia Nguyen
(74) *Attorney, Agent, or Firm* — Kevin T. Cuenot (57) ABSTRACT

An offset cancellation circuit can include an amplifier having a negative input, a positive input, and a single-ended output, wherein the positive input is configured to receive a reference voltage. The circuit also can include a capacitor having a first terminal and a second terminal. The first terminal can be coupled to the negative input of the amplifier. The capacitor can be configured to sample the offset voltage of the amplifier. The second terminal of the capacitor can be selectively coupled to the output of the amplifier.

17 Claims, 4 Drawing Sheets

FIG. 1A

Time = T1

FIG. 1B

Time = T2

DIFFERENTIAL REFERENCE INTERFACE WITH LOW NOISE OFFSET CANCELLATION

FIELD OF THE INVENTION

One or more embodiments disclosed within this specification relate to integrated circuits (ICs). More particularly, one or more embodiments relate to accommodating for input offset voltage of an amplifier and to providing accurate floating different reference voltages within an IC.

BACKGROUND

Differential amplifiers are used in a variety of circuit applications. For example, one application in which differential amplifiers are used is to produce a reference signal. In the idealized case, a differential amplifier that receives equivalent voltages at the positive input and the negative input generates a zero voltage at the output. Non-idealized, e.g., "real-world," differential amplifiers, however, suffer from an imperfection referred to as "input offset voltage." Real world differential amplifiers generate a voltage at the output despite receiving equivalent voltages at the positive and negative inputs due, for example, to various mismatches and/or imperfections in the constituent devices of the differential amplifier. The amount by which one input signal must be altered with respect to the other input signal to shift the output of the differential amplifier to zero volts is referred to as the input offset voltage.

The non-idealized behavior of a differential amplifier described above can be problematic in situations where a high degree of accuracy is desired. For example, in circuit applications where the output of the differential amplifier is used as a reference, unless the input offset voltage is accommodated in some fashion, the output of the amplifier will not be an accurate representation of the input. This inaccuracy in reproducing the input signal can introduce errors into any process relying on the amplifier for an accurate reference signal.

SUMMARY

One or more embodiments disclosed within this specification relate to integrated circuits (ICs). More particularly, one or more embodiments relate to accommodating for input offset voltage of an amplifier and to providing accurate floating differential reference voltages within an IC.

An embodiment can include a circuit. The circuit can include an amplifier having a negative input, a positive input, and a single-ended output. The positive input can be configured to receive a reference voltage. The circuit also can include a capacitor having a first terminal and a second terminal. The first terminal can be coupled to the negative input of the amplifier. The capacitor can be configured to sample an input offset voltage of the amplifier. The second terminal can be selectively coupled to the output of the amplifier.

Another embodiment can include a circuit. The circuit can include a first amplifier including a negative input, a positive input, and an output. The circuit can include a first capacitor associated with the negative input and a second capacitor associated with the positive input. During a first mode of operation, the first capacitor can be coupled across a reference voltage and the negative input of the first amplifier and charge to an input offset voltage of the first amplifier. Also during the first mode of operation, the positive input of the first amplifier can be coupled to the reference voltage. During a second mode of operation, the first capacitor can be coupled across the output and the negative input of the first amplifier and the second capacitor can be coupled to the positive input of the first amplifier to convey a data signal.

Another embodiment can include a method of operation for a circuit. The method can include processing a data signal through a positive input of an amplifier and determining an input offset voltage of the amplifier during a first mode of operation. During a second mode of operation, a correction for the input offset voltage of the amplifier can be applied through a negative input of the amplifier.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to accommodating for input offset voltage of an amplifier and providing accurate floating differential reference voltages within an IC. In one or more embodiments, the input offset voltage of an amplifier can be accommodated by selectively inserting a capacitive circuit element into a feedback loop of the amplifier. A feedback loop can be formed between the output of the amplifier and the negative input of the amplifier. In general, the capacitive element, when not within the feedback loop of the amplifier, can be charged to a voltage that is substantially equivalent to the input offset voltage of the amplifier. Once charged to the same voltage potential as the input offset voltage, the capacitor can be placed in the feedback loop of the amplifier. Discharge of the voltage potential stored by the capacitor can help to accommodate for the input offset voltage of the amplifier.

One or more embodiments also relate to providing accurate and offset-free floating differential reference voltages. One or more accurate voltage reference levels can be created from an accurate and arbitrary reference source. In addition, a common-mode shift circuit can be used to provide additional flexibility in that output levels that exceed the power supply voltage can be generated. Accordingly, an accurate, floating differential reference voltage can be derived from an external ground-referenced reference voltage.

Figure 1A:
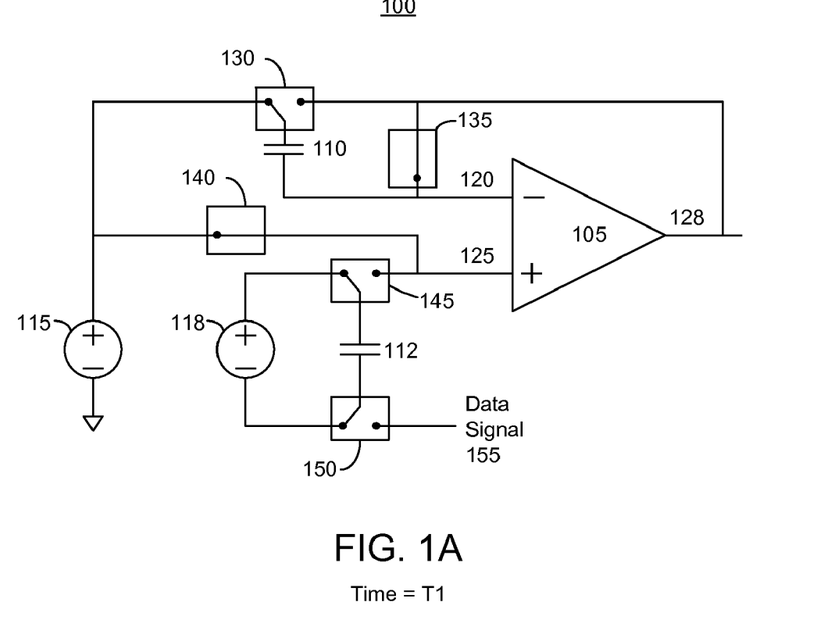
FIGS. 1A and 1B are first and second circuit diagrams illustrating a circuit in accordance with an embodiment disclosed within this specification.
Figure 1B:
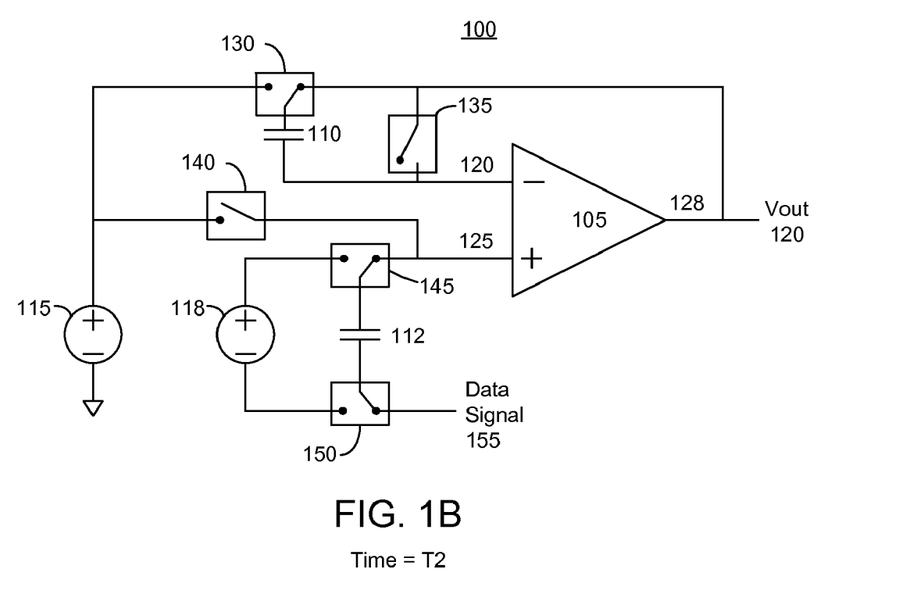

FIGS. 1A and 1B are first and second circuit diagrams illustrating a circuit 100 in accordance with an embodiment disclosed within this specification. Circuit 100 can be configured to perform input offset voltage cancellation. FIG. 1A illustrates connections of circuit 100 as of a selected time denoted as T1. FIG. 1A generally illustrates a configuration of circuit 100 during a first mode of operation referred to as a sample phase. FIG. 1B illustrates connections of circuit 100 as of a different time, e.g., a subsequent time denoted as T2. FIG. 1B generally illustrates a configuration of circuit 100 during a second mode of operation referred to as a hold phase. Referring to both FIGS. 1A and 1B, circuit 100 can include an amplifier 105, capacitors 110 and 112, and reference voltages (references) 115 and 118. Circuit 100 further can include switches 130, 135, 140, 145, and 150. In an embodiment, capacitors 110 and 112 can be sized substantially the same and, therefore, have substantially the same capacitive values.

By selectively opening and closing, or switching state, of switches 130 and 135, capacitor 110 can be selectively coupled to different portions of circuit 100 as will be described within this specification in further detail. Similarly, selectively opening and closing, or switching state, of switches 140-150 can selectively couple capacitor 112 to different portions of circuit 100. For purposes of clarity, control signals to switches 130-150 are not shown. It should be appreciated, however, that control signals can be generated by a control circuit to cause switches 130-150 to open, close, or switch state as described within this specification to effectuate the functionality described. Further, each switch can be implemented using any of a variety of different switching circuits, or a combination of switching circuits, which are known to the skilled artisan.

Referring to FIG. 1A, amplifier 105 can include a negative input 120, a positive input 125, and an output 128. Amplifier 105 can be implemented using any of a variety of different amplifier architectures that include a differential input and a single-ended output. For example, amplifier 105 can be implemented in the form of an operational-transconductance amplifier. Amplifier 105 can be implemented using any of a variety of transistor devices such as, for example, bipolar junction transistors, metal oxide semiconductor transistors, junction field effect transistors, or the like. Amplifier 105 can be implemented within an IC or with one or more discrete transistor devices.

At time T1, switch 135 is closed, thereby coupling output 128 of amplifier 105 to negative input 120. Coupling output 128 to negative input 120 in this manner creates a negative feedback loop and configures amplifier 105 as a unity gain buffer (buffer). With amplifier 105 configured as a buffer, the voltage at output 128 is equal to the voltage applied to positive input 125. A first terminal of capacitor 110 is coupled to negative input 120. Switch 130 is placed in a state to couple a second terminal of capacitor 110 to reference 115, e.g., the positive terminal of reference 115.

Also at time T1, switch 140 can be closed, thereby coupling reference 115, e.g., the positive terminal of reference 115, to positive input 125. In this configuration, the voltage at output 128 is approximately equal to the voltage potential of reference 115 at input 125. As shown, switches 145 and 150 are placed in a state so that capacitor 112 is placed in parallel across reference 118. The state of switches 145 and 150 uncouples data signal 155 from amplifier 105 at time T1.

In an embodiment, reference 115 can provide a voltage that can be an approximation or approximately equal to the voltage potential of reference 118 plus the data signal 155. The voltage of reference 118 can be selected to provide any of a plurality of different reference voltages to which capacitor 112 can be charged during the sample phase. Particular exemplary voltages that can be provided by source 118 are described in greater detail with reference to FIGS. 2 and 3 of this specification.

Since amplifier 105 is implemented with non-ideal devices, amplifier 105 has a finite amount of gain. In addition, with amplifier 105 being a differential amplifier, the non-idealities of the devices, e.g., mismatches in device size and/or device performance, used to implement amplifier 105 can influence the differential symmetry of amplifier 105. The finite gain and the presence of device mismatches within amplifier 105 can result in an error in the level of input voltage required to drive the voltage at output 128 to zero volts. This error voltage is often referred to as an "input offset voltage" or an "offset voltage."

For example, within FIG. 1A, amplifier 105 is configured as a buffer with positive input 125 being coupled to reference 115. Ideally, the voltage at output 128 is equal to the voltage of reference 115. Within a non-ideal amplifier, e.g., amplifier 105, some level of differential direct current (DC) voltage must be applied across inputs 120 and 125 of amplifier 105 to generate the voltage potential of reference 115 at output 128. The input offset voltage, also referred to as the "input offset voltage error," of amplifier 105 can be determined as the difference in voltage potential between reference 115 and the voltage at output 128 when input 120 is tied to output 128.

In particular circuit applications, the presence of an input offset voltage within an amplifier can impact critical performance characteristics of the circuit. For example, when circuit 100 is used to implement an accurate reference voltage buffer, the presence of an input offset voltage results in an error in the voltage at output 128 of amplifier 105 as compared to the reference voltage applied to positive input 125. When used as a reference for an analog-to-digital converter (ADC), for example, this error results in an error in the gain of the ADC. The error in the voltage level at output 128 creates an inaccuracy in the reference voltage generated by amplifier 105. Compensating for this voltage error can be difficult since the offset voltage present at the inputs of each amplifier that may be used to implement a buffer providing a reference voltage can differ in terms of level and polarity.

In illustration, the analog input voltage to an ADC is compared to a voltage range that can be specified by the output of each of two buffers that define the full scale range of the ADC. The input offset voltage of the amplifier within each buffer can produce a gain error within the ADC. Consider the case in which the voltage range defined by the output of the two buffers is 1 V and the offset voltage of each of the amplifiers within those buffers is approximately 14 mV. The input offset voltages are stochastic and, as such, add as sqrt(2). The voltage range to which the analog voltage provided to the ADC as input is compared can shift to produce a voltage range of approximately 1.02 volts. The increase in the voltage range would generate an error in the digital values generated by the ADC as compared to the actual voltage received at the input to the ADC. This is equivalent to a 2% gain error, which is unacceptable in most applications.

To compensate for the level of offset voltage of amplifier 105, at time T1 a first terminal of capacitor 110 is coupled to the negative input terminal 120. With switch 130 in a state as shown, the second and opposite terminal of capacitor 110 is coupled to reference 115. In this configuration, the voltage applied across capacitor 110 is approximately equal to the offset voltage appearing across inputs 120 and 125 of amplifier 105. When capacitor 110 remains coupled in this configuration for a sufficient period of time to achieve steady state, capacitor 110 samples the input offset voltage present within amplifier 105.

Referring to FIG. 1B at time T2, the state of switch 130 is changed, thereby uncoupling the second terminal of capacitor 110 from reference 115 and coupling the second terminal to output 128 of amplifier 105. In addition, switch 135 is open, thereby uncoupling output 128 of amplifier 105 from negative input 120. In this configuration, the offset voltage appearing across negative input 120 and positive input 125 is applied across negative input 120 and output 128 by capacitor 110. Capacitor 110 effectively shifts the voltage at negative input 120 by the same voltage potential as the input offset voltage that appears across negative input 120 and positive 125 of amplifier 105.

Also at time T2, the state of switches 145 and 150 change, thereby coupling data signal 155 to one terminal of capacitor 112 and the other terminal of capacitor 112 to positive input 125 of amplifier 105. Changing state of switches 145 and 150 uncouples capacitor 112 from reference 118. Further, switch 140 is open, thereby uncoupling reference 115 from positive input 125. In the configuration illustrated in FIG. 1B, the voltage sampled by capacitor 112 from reference 118 is effectively coupled, and applied to, input 125 in conjunction with data signal 155.

For example, the voltage applied by reference 115 can be 1.25 V. Reference 115 can represent an on-chip band-gap circuit or an external, off-chip voltage reference. The input offset voltage inherent within amplifier 105 can be ±15 mV. For purposes of illustration, consider the case in which negative input 120 is 15 mV less than input 125. When configured as a buffer, reference 115 is applied to positive input 125. Further, the voltage appearing at negative input 120, and accordingly at output 128, is approximately equal to 1.25 V-0.015 V or 1.235V. At time T1 illustrated in FIG. 1A, the second terminal of capacitor 110 is coupled to reference 115. With 15 mV of offset voltage within amplifier 105, negative input 120 of amplifier 105 and the first terminal of capacitor 110 remain at 1.235 V. The second terminal of capacitor 110, being coupled to reference 115, remains at 1.25 V. By allowing sufficient time, the voltage across capacitor 110 reaches a steady state at 15 mV.

At time T2 illustrated in FIG. 1B, the second terminal of capacitor 110 is uncoupled from reference 115. Further, output 128 is uncoupled from negative input 120 and, instead, coupled to the second terminal of capacitor 110. Positive input 125 is coupled to capacitor 112 and data signal 155. Reference 118 and capacitor 112, for example, can be used to shift or otherwise alter data signal 155 as will be described in further detail with reference to FIGS. 2 and 3 of this specification. As noted, reference 118 can be any of a variety of voltage potentials, including a potential of zero volts. The presence of the 15 mV stored across capacitor 110 shifts the voltage at output 128 to correct for the input offset voltage of amplifier 105 as measured during the sample phase.

Eventually, capacitor 110 discharges and the voltage across capacitor 110 returns to approximately 0 V. However, within a data sampling system, for example, circuit 100 can be returned to the configuration illustrated in FIG. 1A at time T1 to restore the offset voltage across capacitor 110. By properly sizing capacitor 110 to store sufficient charge, e.g., enough charge to maintain the offset voltage when charged for a predetermined period of time, a reference voltage can be periodically applied to amplifier 105 with the offset voltage being cancelled by application of capacitor 110 across input 120 and output 128.

In general, the input offset voltage of amplifier 105 can change over time, e.g., with changes in temperature. Use of capacitor 110 effectively samples the input offset voltage of amplifier 105 at defined intervals. As the input offset voltage of amplifier 105 shifts, capacitor 110 samples the shifted input offset voltage and applies the sampled voltage as described. Thus, the compensation applied to accommodate for the input offset voltage is able to adapt and shift with the changes in the input offset voltage of amplifier 105 over time. Accordingly, circuit 100 can compensate for random and systematic effects that would otherwise exist.

Figure 2:
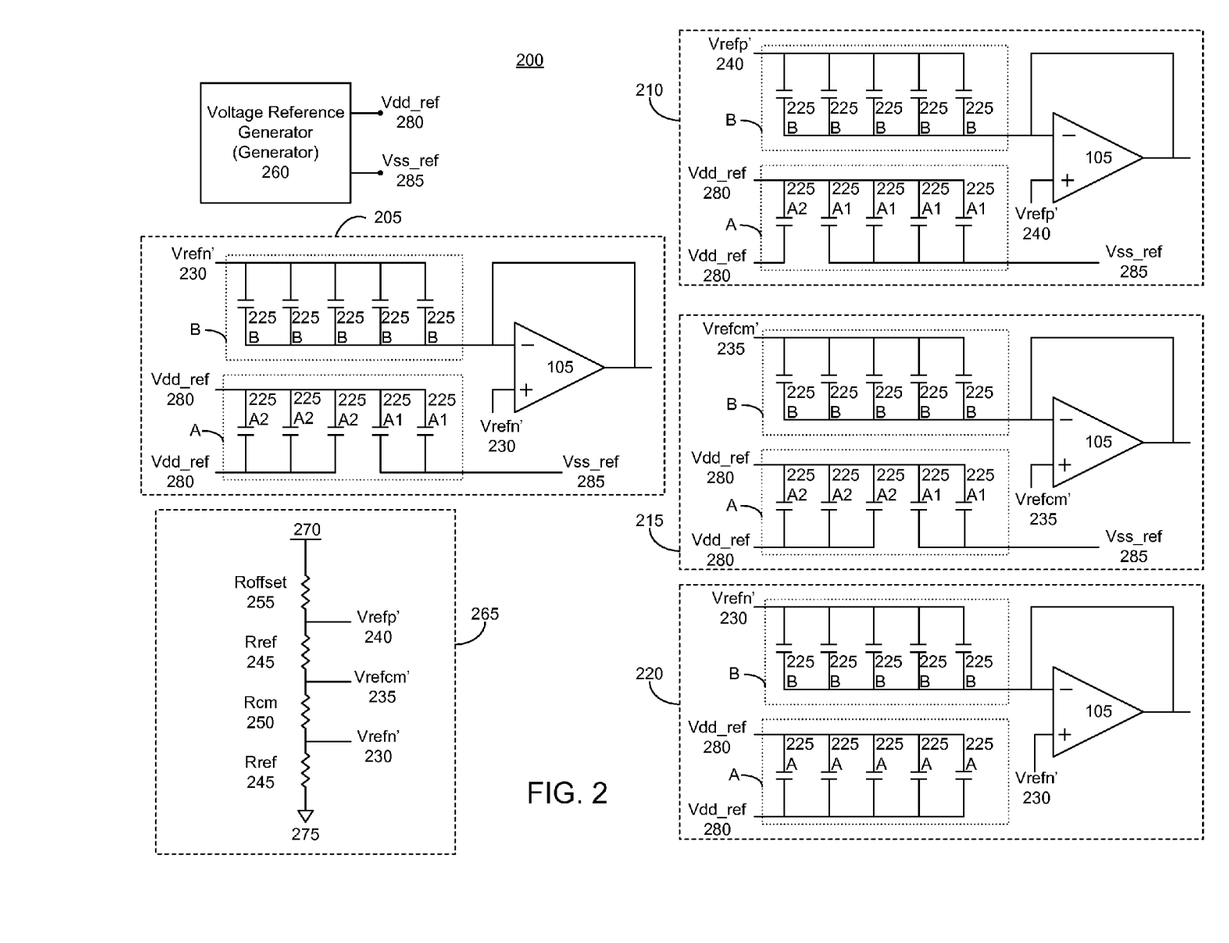
FIG. 2 is a third circuit diagram illustrating a circuit in accordance with another embodiment disclosed within this specification.
Figure 3:
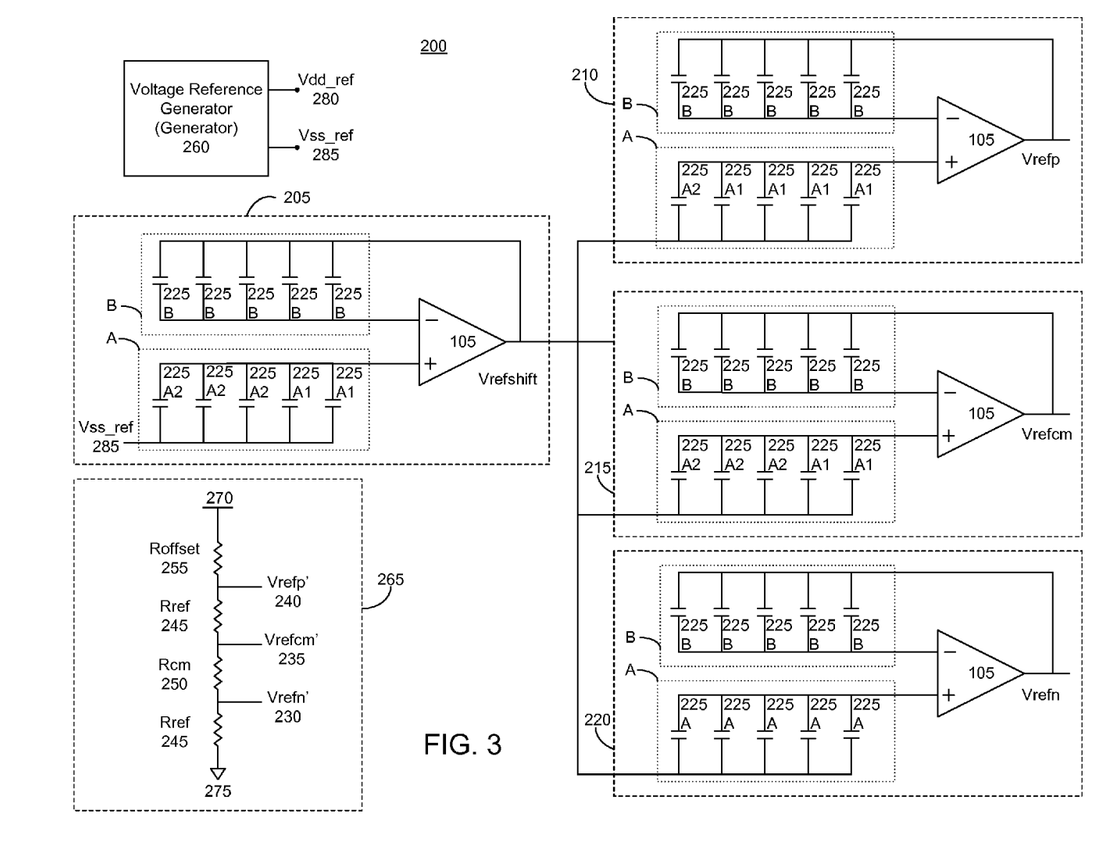
FIG. 3 is a fourth circuit diagram illustrating the circuit of FIG. 2 in accordance with another embodiment disclosed within this specification.

FIGS. 2 and 3, taken collectively, illustrate a circuit architecture that can produce an accurate floating reference with matched impedances at output terminals of the circuit. The floating reference can be a scaled version of the external reference provided. In illustration, when the external reference specifies a range of approximately 0 V-1.25 V, the circuits illustrated in FIGS. 2 and 3 can produce a floating differential reference that spans from approximately 0.5 V to 1.5 V. FIGS. 2 and 3 utilize aspects described with reference to FIGS. 1A and 1B. Within FIGS. 2 and 3, however, multiple stages are illustrated and, within each stage, capacitors 110 and 112 each have been replaced with two or more unit capacitors.

FIG. 2 is a third circuit diagram illustrating a circuit 200 in accordance with another embodiment disclosed within this specification. In an embodiment, circuit 200 can implement a switch capacitor reference voltage circuit having input offset correction. Like numbers will be used to refer to the same items throughout this specification to the extent necessary. FIG. 2 illustrates a configuration of circuit 200 during a first mode of operation corresponding to the sample phase of a data sampling system within which circuit 200 is used and/or implemented. For purposes of clarity and illustration, switching circuits are not shown in FIG. 2. It should be appreciated, however, that one or more switches can be included to effectuate the functionality described and to couple and/or uncouple selected ones of the capacitors and/or capacitor sets to be described within this specification in greater detail.

Data sampling systems typically cycle between a sample phase and a hold phase. During the sample phase, analog data is measured or "sampled" and given time to reach steady state. During the hold phase, the measured data value is frozen or "held" and provided as stable data for a next block of the system as a reference or to sample and store.

Circuit 200 can include buffers 205, 210, 215, 220, a reference voltage generator (generator) 260, and a shift voltage source (source) 265. Each of buffers 205-220 can be configured to provide a reference voltage. Referring to the example in which circuit 200 is incorporated into a data sampling system, buffers 205-220 can provide reference voltages that can be used for purposes of accurate analog-to-digital conversions. Each of buffers 205-220 can include an amplifier 105 and two sets capacitors illustrated as capacitor sets A and B.

The circuit architecture illustrated in FIGS. 2 and 3 utilizes buffer 205 to provide a voltage shift, which can be referred to as Vrefshift. The output from buffer 205, i.e., Vrefshift, can be provided to each of buffers 210-220 as an input. Vrefshift can be a common mode shift voltage that can be added to each of the positive inputs of each of buffers 210-220 during the hold phase that is illustrated in FIG. 3. Vrefshift can be selected to be any of a variety of different output voltages. For purposes of illustration, Vrefshift is set equal to Vrefn in the examples described within this specification. The examples provided, however, are not intended to limit the one or more embodiments disclosed herein.

Capacitor sets A and B are denoted in FIG. 2 simply as "A" and a "B" respectively. Within each of buffers 205-220, the bottom row of capacitors 225 forms capacitor set A. The top row of capacitors within each of buffers 205-220 forms capacitor set B. As shown, each of capacitor sets A and B can include two or more capacitors 225. Each of capacitors 225 can be a unit capacitor of a fixed and same size and capacitive value as used within a data sampling system in order to improve matching between various aspects of the data sampling system. As shown, capacitor set A includes a same number of capacitors as capacitor set B. Capacitors that belong to capacitor set A are denoted within FIG. 2 as "225A," whereas capacitors belonging to capacitor set B are denoted as "225B." Within switched capacitor circuits, gain and filtering values often are implemented by ratios determined according to a number of same sized unit capacitors implemented throughout the circuit. Capacitor set A within each of buffers 205-220 can utilize this ratio approach to generate a reference voltage via charge redistribution.

As shown, source 265 can be configured to generate a plurality of reference voltages shown as Vrefn' 230, Vrefcm' 235, and Vrefp' 240. In an embodiment, source 265 can be implemented with a resistor ladder. For example, resistors such as Roffset 255, Rref 245, Rcm 250, and Rref 245 can be coupled in series between two voltage supplies or references such as 270 and 275. The relative ratios of the resistors can be used to determine the voltage potentials of each of voltages Vrefn' 230, Vrefcm' 235, and Vrefp' 240. For example, within an ADC, (Vrefp' 240−Vrefn' 230) can represent the full scale range of the ADC. The voltage Vrefcm' 235 can be set to a common mode voltage that resides between Vrefp' 240 and Vrefn' 230, e.g. at a voltage (Vrefp' 240+Vrefn' 230)/2.

Each of Vrefn' 230, Vrefcm' 235, and Vrefp' 240 can represent an approximation of a voltage expected to be output from one of buffers 205-220 during the hold phase illustrated in FIG. 3. During the sample phase shown in FIG. 2, each of the voltages generated by source 265 is coupled to a positive input of one or more of amplifiers 105 as shown. For example, Vrefn' 230 is coupled to the positive input of amplifier 105 of buffer 205. Vrefn' 230 is an approximation of a voltage Vrefn that is expected to be output from buffer 205 in the hold phase. Vrefp' 240 is coupled to the positive input of amplifier 105 of buffer 210. Vrefp' 240 is an approximation of the voltage Vrefp that is expected to be output from buffer 210 in the hold phase. Vrefcm' 235 is coupled to the positive input of amplifier 105 of buffer 215. Vrefcm' 235 is an approximation of the voltage that is expected to be output from buffer 210 in the hold phase. Vrefn' 230 is also coupled to the positive input of amplifier 105 of buffer 220. Vrefn' 230, as noted, is an approximation of the voltage Vrefn that is expected to be output from buffer 220 in the hold phase.

As noted, in the example illustrated in FIGS. 2 and 3, Vrefshift is set equal to Vrefn. Accordingly, Vrefn' 230 is provided to the positive input of amplifier 105 of buffer 205 and to the positive input of amplifier 105 of buffer 210 in FIG. 2. It should be appreciated, however, that when Vrefshift is not equal to Vrefn or another reference voltage described herein, different resistive ladder configurations can be used to effectuate the desired value of Vrefshift. In one example, when Vrefshift is not equal to Vrefn' 230, the resistor Rref 245 can be split into two different resistors allowing an additional reference voltage to be extracted from source 265 from the location where Rref 245 is "split." Consider the case in which Vrefshift is less than Vrefn' 230. In that case, an additional voltage of Vrefshift', which approximates the actual desired voltage of Vrefshift that is to be output from amplifier 105 of buffer 205, would need to be tapped off from a point along Rref 245, i.e., from a node between the two resistors into which Rref 245 is split.

The different voltages of source 265 allow each respective amplifier 105 to approximate conditions necessary to sample the offset voltage during the sample phase. Within this specification, the reference voltages generated by source 265 are identified using an apostrophe, e.g., a "prime," to indicate that the voltage is an approximation of an actual voltage to be output from one or more of buffers 205-220. The actual voltages output by buffers 205-220 are identified without the prime designation, e.g., as shown in FIG. 3.

Generator 260 can generate two voltage references illustrated as Vdd_ref 280 and Vss_ref 285. In an embodiment, Vdd_ref 280 and Vss_ref 285 can represent external pins of an IC including circuit 200. For example, Vdd_ref 280 can be set to 1.25V and Vss_ref 285 can be set to 0V. The specific numerical voltages given are for purposes of illustration and are not intended to limit the one or more embodiments disclosed within this specification.

In an embodiment, during the sample period, a first subset of capacitors of capacitor set A can have one or more reference voltages produced by generator 260 applied across the terminals. Subsets of capacitor set A are denoted in FIG. 2 using a "1" in reference to a first subset and a "2" in reference to a second subset. Accordingly, the first subset of capacitor set A can be referred to as subset A1, where each capacitor in subset A1 is labeled in FIG. 2 as "225A1." The second subset of capacitor set A can be referred to as subset A2, where each capacitor in subset A2 is labeled in FIG. 2 as "225A2."

Of the five capacitors within capacitor set A in buffer 205, those of subset A1 have a voltage of (Vdd_ref 280−Vss_ref 285) applied across the terminals. The remaining capacitors 225, e.g., those of subset A2, have a same reference voltage, i.e., Vdd_ref 280 applied across both terminals. Accordingly, capacitors 225 of subset A2 store no charge. During a subsequent hold period, each capacitor 225 of capacitor set A is coupled in parallel so that charge stored within capacitor subset A2 is permitted to redistribute across all capacitors 225 within capacitor set A.

For example, consider the case in which Vdd_ref 280 is at 1.25 volts and Vss_ref 285 is at ground. Capacitor set A in buffer 205 can charge to ⅖ of 1.25 volts, or 0.5 volts in consequence of charge redistribution. The 0.5 volts will be applied to the positive input of amplifier 105 of buffer 205 during the hold phase. In that case, resistances of source 265 are selected such that Vrefn' 230 will be approximately 0.5 volts. Accordingly, during the sample phase, the voltage applied to the positive input of amplifier 105 of buffer 205 is approximately equal to the voltage applied to the positive input of amplifier 105 of buffer 205 during the hold phase. The same approach can be applied to each of buffers 210-220 with Vrefp' 240, Vrefcm' 235, and Vrefn' 230 respectively.

A similar configuration exists within each of buffers 210-220 as described in reference to buffer 205. In particular, subset A1 within each of buffers 210-215 is initially charged to a voltage of (Vdd_ref 280-Vss_ref 285). Capacitors 225 of subset A2 initially store no charge. Referring to buffer 220, capacitor set A is not subdivided into subsets and a same voltage is applied to each side of the capacitors 225. As such, capacitors 225 of capacitor set A in buffer 220 store no charge. During the subsequent hold period, each capacitor 225 of subset A2 within buffers 210-215 are coupled in parallel and charge stored within subset A2 is permitted to redistribute across all capacitors 225 of capacitor set A. During the hold phase as charge redistributes, capacitor set A is decoupled from supply Vdd_ref 280 and Vss_ref 285 thereby creating a floating voltage that appears across the terminals of capacitor set A.

Thus, a voltage that is a ratio of (Vdd_ref 280-Vss_ref 285) is generated across capacitor set A within buffers 205-215. Referring to buffer 205, the combination of the two capacitors 225A1 of subset A1 are charged to the voltage (Vdd_ref 280-Vss_ref 285). The combination of capacitors 225A2 of subset A2 store no charge. When subset A1 and subset A2 are joined in parallel as is illustrated in FIG. 3, the voltage potential on subset A1 is distributed through capacitor set A, resulting in a charge of only ⅔(Vdd_ref 280-Vss_ref 285) across capacitor set A. In effect, the charge redistribution reduces the voltage from that of (Vdd_ref 280-Vss_ref 285) to that of a (number of capacitors in subset A1)/(number of capacitors in capacitor set A)*(Vdd_ref 280-Vss_ref 285).

Referring to buffer 210, for example, subset A1 is initially charged to a voltage of (Vdd_ref 280-Vss_ref 285). After charge redistribution, the voltage across capacitor set A is ⅘(Vdd_ref 280-Vss_ref 285). Buffer 215 exhibits the same charge redistribution characteristics as buffer 205. Buffer 220, however, does not utilize the ratio technique described. As such, the voltage across capacitor set A remains the same from FIG. 2 to FIG. 3.

It should be appreciated that capacitor set A within each of buffers 205-220 can have differing ratios of capacitors allocated to subset A1 and subset A2 as illustrated during the sampling phase. Using this technique, differing reference voltages can be generated that are a ratio of the reference voltage provided by generator 260. In addition, by using unit capacitors, the differing ratios of voltages resulting upon each set of capacitors are correlated to other capacitor ratios within circuit 200 and, for example, within a larger data sampling system. For instance, although absolute capacitive values for a particular capacitor within an IC manufacturing process may vary 10-20% when factoring process variation and usage, matching between like sized capacitors can be less than 0.1% within some IC manufacturing processes.

Alteration of the configuration of circuit 200 between the sample phase and the hold phase can be accomplished using a plurality of switches (not shown). During operation of circuit 200, these switches are opened and closed to couple the various nodes described together. Being implemented with transistor devices, the switches have parasitic capacitances associated with the terminals of the devices that are charged and discharged as the switches are opened and closed. This charging and discharging of the parasitic capacitances associated with the switches can inject charge into nodes of circuit 200 that can create sampling errors.

The capacitors within set B within each of buffers 205-220 are coupled in parallel. In a data sampling system such as, for example, a successive approximation ADC, set B is included in each of buffers 205-220 to obtain a balanced differential structure of buffers 205-220 and to cancel the effects of charge injection within the system.

The presence of capacitor set B within circuit 200 can be leveraged to sample the offset voltage of each of amplifiers 105 within buffers 205-220. During the sample phase, each capacitor of capacitor set B can be coupled between a reference voltage and the negative input of amplifier 105. For example, within buffer 205 each of capacitors 225B is coupled between Vrefn' 230 and the negative input of amplifier 105. Within buffer 210, each of capacitors 225B is coupled between Vrefp' 240 and the negative input of amplifier 105. Within buffer 215, each of capacitors 225B is coupled between Vrefcm' 235 and the negative input of amplifier 105. Within buffer 220, each of capacitors 225B is coupled between Vrefn' 230 and the negative input of amplifier 105. The positive terminal of amplifier 105 within each of buffers 205-220 is coupled to a same reference voltage as capacitor set B within each respective buffer. Thus, referring to buffer 205, the positive input to amplifier 105 is coupled to Vrefn' 230. Within buffer 210, the positive input to amplifier 105 is coupled to Vrefp' 240, etc.

When configured as pictured in FIG. 2 at time T1, the input offset voltage of amplifier 105 within each of buffers 205-220 is sampled by capacitor set B. When the sample phase is maintained for a period of time sufficient for the voltage across each of capacitors 225B of capacitor set B to reach steady state, capacitor set B within each of buffers 205-220 can store the input offset voltage of amplifier 105 within each respective one of buffers 205-220.

FIG. 3 is a fourth circuit diagram illustrating circuit 200 of FIG. 2 in accordance with another embodiment disclosed within this specification. More particularly, FIG. 3 illustrates a configuration of circuit 200 during the hold phase of a data sampling system within which circuit 200 is implemented. As such, FIG. 3 illustrates connections that are switched or changed when moving from a sample phase, as illustrated in FIG. 2, to the hold phase. As was the case with respect to FIG. 2, switching circuits are not shown in FIG. 2 for purposes of clarity.

In particular, within each of buffers 205-220, each of capacitors 225 of capacitor set A is switched to being coupled in parallel. Thus, one node of each capacitor 225 of capacitor set A is coupled to a reference with the other node of each capacitor 225 of capacitor set A being coupled to the positive input of amplifier 105. Referring to buffer 205, the reference to which capacitors 225A are coupled is Vss_ref 285. Within buffers 210-220, the reference to which capacitors 225A are coupled is the output of amplifier 105 of buffer 205, e.g., which is, once settled, ⅗ (Vdd_ref 280-Vss_ref 285) now corrected to account for the offset voltage. Once circuit 200 is switched to the configuration illustrated in FIG. 3, capacitor set A within each of buffers 205-220 is coupled in parallel, thereby allowing charge redistribution to occur.

As configured in FIG. 3, each of capacitor sets A provides an input signal, e.g., a data signal, to the positive input of amplifier 105. As described in further detail below, during the hold phase, each of buffers 205-220 outputs an accurate voltage that is corrected for input offset voltage of each respective amplifier 105. Buffer 205, for example, outputs Vrefshift. As noted, in the example configuration pictured in FIG. 3, Vrefshift can be substantially equal to Vrefn, e.g., the actual voltage that Vrefn' 230 is intended to approximate. Vrefshift as output by buffer 205, however, can be selected to be any of a variety of different output voltages so as to provide a desired amount of voltage shift to each of buffers 210-220. Buffer 210 outputs a voltage of Vrefp, which is the voltage that Vrefp' 240 is intended to approximate. Buffer 215 outputs a voltage of Vrefcm, which is the voltage that Vrefcm' 235 is intended to approximate. Buffer 220 outputs a voltage of Vrefn.

Input offset voltage correction occurs through capacitor set B of each of buffers 205-220. Within each of buffers 205-220, capacitor set B is decoupled from the voltage reference and switched to being coupled to the output of amplifier 105. Thus, one node of each of capacitors 225B is coupled to the negative input of amplifier 105 and the second node of each of capacitors 225B is coupled to the output of amplifier 105.

In FIG. 3, capacitor set B within each of buffers 205-220 has stored the input offset voltage of amplifier 105. The input offset voltage stored in capacitor set B is applied in the feedback loop to correct the input offset voltage of each respective amplifier 105. As such, the voltage present at the positive node of amplifier 105, as determined using a ratio established by subset A1 and subset A2, will be at the output of each of amplifiers 105. Within each of buffers 205-220, capacitor set A provides the stored voltage as determined using the ratio of subsets A1 and A2 including any voltage that is supplied from a prior stage, e.g., where the output of buffer 205 is coupled to capacitor set A within each of buffers 210-220.

FIGS. 2 and 3 illustrate how accurate reference levels can be created from an arbitrary and accurate reference voltage, e.g., generator 260. The negative input of each amplifier 105 is utilized for correction of input offset voltage, while the positive input is utilized during the hold phase to process the data signal, e.g., the signal from capacitor set A. Using buffer 205 as a first stage that can be coupled to buffers 210, 215, and 220 allows buffer 205 to function as a common-mode shift circuit outputting Vrefshift. Accordingly, output levels that are greater than Vdd_ref 280 can be generated from buffers 210, 215, and/or 220. For example, using the circuit configuration illustrated in FIGS. 2 and 3, voltages of Vrefp=2.5 V, Vrefcm=2 V, and Vrefn=1.5 V can be generated when Vdd_ref 280 is set to 1.25 V.

Within a conventional data sampling system, two additional, and smaller, capacitors, sometimes referred to as "mini-caps," are included within each of buffers 205-220. One terminal of each mini-cap is coupled to one of the inputs of amplifier 105. More particularly, a first terminal of the first mini-cap is coupled to the negative input of the amplifier and a first terminal of the second mini-cap is coupled to the positive input of the amplifier. During the sample phase, a second terminal of the first mini-cap is coupled to the positive input of amplifier 105 in order to sample the input offset voltage of amplifier 105. During the subsequent hold phase, each mini-cap is placed in series with a set of capacitors by coupling the second terminal of each mini-cap to the set of capacitors. As such, the second terminal of the first mini-cap is coupled in series, e.g., to a set of capacitors similar to that of capacitor set B, in order to compensate for the input offset voltage error introduced by amplifier 105. The second mini-cap is discharged during the sampling phase, then subsequently coupled in series between the positive input of amplifier 105 and capacitor set B. The second mini-cap serves to retain the differential input symmetry of each of buffers 205-220, particularly from the impact of charge injection when switching between the sample and hold phases of operation.

While the introduction of a mini-cap in series with the negative input of amplifier 105 removes offset, as described in the previous paragraph, introduction of a mini-cap can also add substantial kT/C noise to amplifier 105. Because the capacitive value of the mini-cap is small relative to the total capacitance of capacitor set B, which is coupled in parallel, the mini-cap adds a larger quantity of kT/C noise into amplifier 105 than capacitor set B. As the total capacitance of capacitor set B is typically more than five times larger than the capacitive value of the mini-cap, the kT/C noise can be reduced by a factor of five or more by eliminating the mini-cap and sampling the input offset voltage using capacitor set B instead. Thus, capacitor set B can be leveraged to remove offset, while not adding any noise to the system.

The circuit architectures illustrated within this specification process a data signal, e.g., a reference voltage, provided to a positive input of a differential amplifier. The negative input of the differential amplifier is configured to compensate for random and systematic offsets thereby removing such effects from the system. The mini-caps are not required and, thus, can be eliminated. Accordingly, the signal, or data path, can be kept independent of the error correction path.

It should be appreciated that the circuit architectures illustrated with reference to FIGS. 2 and 3 are described as generating reference voltages of 0.5 V, 1.0 V, and 1.5 V from a source providing a voltage range of 0 V-1.25 V. These voltages are provided for purposes of illustration only and are not intended as limitations. For example, another voltage range can be used for generator 260. Further, other circuit configurations can be implemented in which buffer 205, for example, can be charged to 0.25 V, buffer 210 can be charged to 1.25 V, buffer 215 can be charged to 0.75 V, and buffer 220 can be charged to 0.25 V. Charging buffers 205-220 in this manner still can produce the same output voltages described previously where buffer 205, which provides a voltage shift to each of buffers 210-220, was selected to generate an output approximately equal Vrefn.

FIGS. 2 and 3 illustrate a case in which the number of capacitors in capacitor set A is equal to the number of capacitors in capacitor set B. Further, each capacitor can have a same capacitive value so that the total capacitance of capacitor set A is equal, or substantially equal, to the total capacitance of capacitor set B. It should be appreciated, however, that other capacitor configurations can be used. Different numbers of capacitors can be used in each of capacitor sets A and B so long as the total capacitance provided by capacitor set A is equal, or substantially, to the total capacitance of capacitor set B. For example, consider the case in which a ratio of 1 to 25 is desired between capacitor subsets for charge redistribution purposes in capacitor set A. A configuration in which one unit capacitor is used for one subset and another larger capacitor that provides a capacitance that is equivalent to 24 unit capacitors could be used for the other subset of capacitor set A. Capacitor set B can be formed of one or more capacitors that, in total, provides the same capacitance as capacitor set A. Thus, the number of capacitors in each capacitor set is not equal, though the total capacitance is.

Figure 4:
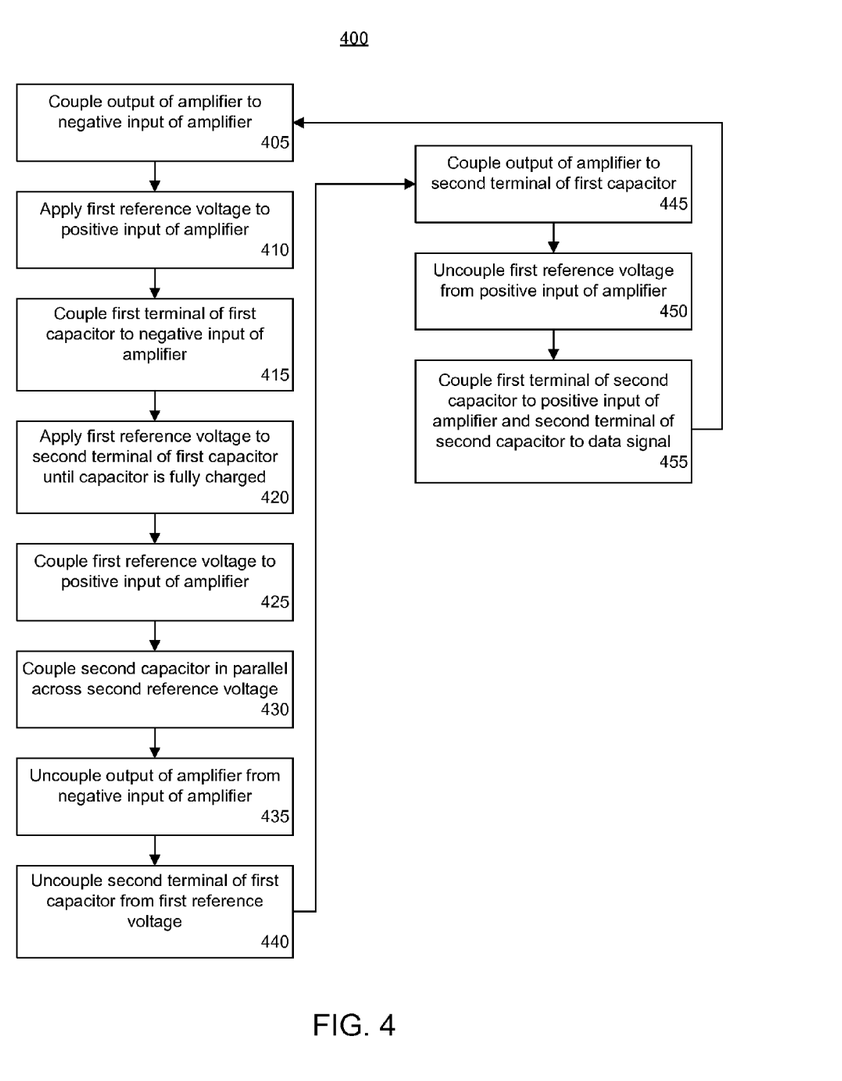
FIG. 4 is a flow chart illustrating a method of operation for a circuit in accordance with another embodiment disclosed within this specification.

FIG. 4 is a flow chart illustrating a method 400 of operation for a circuit in accordance with another embodiment disclosed within this specification. Method 400 illustrates a method of offset voltage cancellation that can be applied to a differential amplifier by switching capacitors into and out of a feedback loop as described in more detail below. It should be appreciated that while method 400 is described with reference to an individual capacitor, two or more capacitors, e.g., a capacitor set, can be substituted or used as described with reference to FIGS. 2 and 3 for each of the capacitors referenced in FIG. 4.

The first capacitor can be substantially equal to the second capacitor in size and, thus, value. When implemented using capacitor sets in place of the first and second capacitors, the two capacitor sets each can include a same number of capacitors. Further, the size and value of each capacitor in each capacitor set can be the same, e.g., matched.

Beginning in step 405, method 400 enters a sample phase corresponding to a first mode of operation. In step 405, an output of the amplifier can be coupled a negative input of the amplifier. As noted, the amplifier can have a differential input and a single-ended output. In step 410, a first reference voltage can be applied to the positive input of the amplifier. In step 415, a first terminal of a first capacitor can be coupled to the negative input of the amplifier. In step 420, the first reference voltage can be applied to the second terminal of the first capacitor until the first capacitor is fully charged. In step 425, the reference voltage can be applied, or coupled, to the positive input of the amplifier. In step 430, a second capacitor can be coupled in parallel across a second reference voltage. Accordingly, the second capacitor charges to the voltage potential of the second reference voltage.

During the sample phase, the first capacitor charges to a value that is substantially equal to the input offset voltage of the differential amplifier. The first capacitor effectively samples the input offset voltage of the differential amplifier. The second capacitor is pre-charged to a selected value corresponding to the voltage potential of the second reference voltage, effectively sampling the voltage potential of the second reference voltage during the sample phase.

Beginning in step 435, method 400 exits the sample phase and enters the hold phase corresponding to a second mode of operation. In step 435, the output of the amplifier can be uncoupled from the negative input of the amplifier. In step 440, the second terminal of the first capacitor can be uncoupled from the first reference voltage. In step 445, the second terminal of the first capacitor can be coupled to the output of the amplifier, thereby inserting the capacitor into the feedback loop of the amplifier to correct for the offset voltage error.

In step 450, the first reference voltage can be uncoupled from the positive input of the amplifier. In step 455, a first terminal of the second capacitor can be coupled to the positive input of the amplifier and the second terminal of the second capacitor can be coupled to a data signal. Accordingly, the voltage sampled by the second capacitor is provided with the data signal to the positive input of the amplifier. The data signal is provided to the positive input of the amplifier concurrently with the first capacitor applying an input offset voltage correction to the negative input of the amplifier.

It should be appreciated that in an embodiment in which capacitor sets are used in place of the first and second capacitors, charge redistribution techniques as described with reference to FIGS. 2 and 3 can be utilized. In that case, during the first mode of operation, first and second subsets of capacitors of the capacitor set replacing the second capacitor can be charged to differing voltage potentials. During the second mode of operation, the two subsets can be coupled in parallel to facilitate charge redistribution when the capacitor set is coupled to the positive input of the amplifier. In another embodiment, capacitor sets can be used in place of the first and second capacitors without utilizing charge redistribution techniques.

The circuit configuration established by steps 405-430 illustrates a first mode of operation as described with reference to FIG. 1A, which is similar to that illustrated in FIG. 2. The circuit configuration established by steps 435-455 illustrates a second mode of operation as described with reference to FIG. 1B, which is similar to that illustrated in FIG. 3. Accordingly, method 400 can iterate as may be required to continue cycling from the first mode to the second mode to correct for the offset voltage error within the amplifier.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart in the figures illustrates the architecture, functionality, and operation of possible implementations of systems and methods according to one or more embodiments disclosed within this specification. In this regard, each block in the flowchart can represent a module, circuit block, or system block that implements the specified function(s). In some alternative implementations, the functions noted in the blocks can occur out of the order noted in the figures. For example, two blocks shown in succession can be executed substantially concurrently, or in some cases, the blocks can be executed in the reverse order depending upon the functionality involved.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An offset cancellation circuit, the circuit comprising:
an amplifier comprising a negative input, a positive input, and a single-ended output; and
a capacitor comprising a first terminal and a second terminal, wherein the first terminal is coupled to the negative input of the amplifier, wherein the capacitor is configured to sample an input offset voltage of the amplifier, and wherein the second terminal is selectively coupled to the output of the amplifier;
wherein, during a first mode of operation, the second terminal of the capacitor is coupled to a reference voltage, the output of the amplifier is coupled to the negative input of the amplifier forming a unity gain buffer, and the positive input of the amplifier is coupled to the reference voltage; and
wherein, during a second mode of operation, the second terminal of the capacitor is uncoupled from the reference voltage and coupled to the output of the amplifier.

2. The circuit of claim 1, wherein the output of the amplifier is uncoupled from the negative input of the amplifier during the second mode of operation.

3. The circuit of claim 2, wherein the capacitor is switched to cycle between the first mode of operation and the second mode of operation.

4. The circuit of claim 1, wherein the capacitor is fully charged to the input offset voltage of the amplifier while in the first mode of operation.

5. The circuit of claim 2, wherein the capacitor applies a voltage approximately equal to the input offset voltage of the amplifier into the negative input of the amplifier when in the second mode of operation.

6. A circuit comprising:
a first amplifier comprising a negative input, a positive input, and an output;
a first capacitor associated with the negative input; and
a second capacitor associated with the positive input,
wherein during a first mode of operation,
a first terminal of the first capacitor is coupled to the negative input of the first amplifier and a second terminal of the first capacitor is coupled to a reference voltage, wherein the first capacitor charges to an input offset voltage of the first amplifier, the positive input is coupled to the reference voltage, and the output of the amplifier is coupled to the negative input of the amplifier forming a unity gain buffer, wherein during a second mode of operation, the first capacitor is coupled across the output and the negative input of the first amplifier, and the second capacitor is coupled to the positive input of the first amplifier to convey a data signal.

7. The circuit of claim 6, wherein the first capacitor and the second capacitor have substantially a same capacitance, and wherein at least one of the first capacitor or the second capacitor comprises a plurality of capacitors.

8. The circuit of claim 6, wherein the second capacitor is charged to a first voltage potential during the first mode of operation.

9. The circuit of claim 6, wherein the second capacitor comprises a plurality of capacitors, wherein a first terminal of each capacitor of the second plurality of capacitors is coupled together, wherein a first subset of capacitors of the second plurality of capacitors is charged to a first voltage potential, and wherein a second subset of capacitors of the second plurality of capacitors is charged to a second voltage potential during the first mode of operation.

10. The circuit of claim 6, wherein the second terminal of the first capacitor is uncoupled from the reference voltage and coupled to the output of the first amplifier during the second mode of operation.

11. The circuit of claim 6, wherein a first terminal of the second capacitor is coupled to the positive input of the first amplifier, wherein the reference voltage is uncoupled from the positive input of the first amplifier, and wherein a second terminal of the second capacitor is coupled to the data signal during the second mode of operation.

12. The circuit of claim 11, wherein during the second mode of operation, the output of the first amplifier is uncoupled from the negative input of the first amplifier.

13. The circuit of claim 12, wherein the first and second plurality of capacitors are switchable to cycle between the first mode of operation and the second mode of operation.

14. The circuit of claim 6, wherein the first amplifier, the first capacitor, and the second capacitor form a first buffer, wherein an output of the first buffer comprises the output of the first amplifier, the circuit further comprising:

a second buffer configured substantially as the first buffer; and a third buffer configured substantially as the first buffer, wherein during the second mode of operation, the output of the first buffer provides a shift voltage to a positive input of the second buffer and the third buffer.

15. The circuit of claim 6, wherein the first amplifier, the first capacitor, and the second capacitor form a first buffer, wherein an output of the first buffer specifies a first floating reference voltage during the second mode of operation, the circuit further comprising:

a second buffer configured substantially as the first buffer, wherein the second buffer outputs a second floating reference voltage during the second mode of operation.

16. A method of operation for a circuit, the method comprising:

processing a data signal through a positive input of an amplifier;

determining an input offset voltage of the amplifier during a first mode of operation in which the amplifier is configured as a unity gain buffer; and applying a correction for the input offset voltage of the amplifier through a negative input of the amplifier during a second mode of operation.

17. The method of claim 16, further comprising:

during the first mode of operation, coupling a first terminal of a first capacitor to the negative input of the amplifier and a second terminal of the first capacitor to a reference voltage;

coupling an output of the amplifier to the negative input of the amplifier;

coupling the reference voltage to the positive input of the amplifier;

charging the first capacitor to the input offset voltage of the amplifier;

charging a second capacitor to a first voltage potential;

during the second mode of operation, uncoupling the output of the amplifier from the negative input;

uncoupling the second terminal of the first capacitor from the reference voltage;

coupling the output of the amplifier to the second terminal of the first capacitor;

uncoupling the reference voltage from the positive input of the amplifier; and coupling the second capacitor to the positive input of the amplifier.

\* \* \* \* \*